US011163923B2

United States Patent
Ramsay et al.

(10) Patent No.: US 11,163,923 B2
(45) Date of Patent: Nov. 2, 2021

(54) AUTOMATED UPSCALING OF RELATIVE PERMEABILITY AND CAPILLARY PRESSURE IN MULTI-POROSITY SYSTEMS

(71) Applicant: Landmark Graphics Corporation, Houston, TX (US)

(72) Inventors: Travis St. George Ramsay, Hockley, TX (US); Richard Edward Hinkley, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 868 days.

(21) Appl. No.: 15/758,573

(22) PCT Filed: Feb. 14, 2017

(86) PCT No.: PCT/US2017/017826
§ 371 (c)(1),
(2) Date: Mar. 8, 2018

(87) PCT Pub. No.: WO2018/151707
PCT Pub. Date: Aug. 23, 2018

(65) Prior Publication Data
US 2019/0026405 A1 Jan. 24, 2019

(51) Int. Cl.
*G06F 30/20* (2020.01)
*G06Q 50/02* (2012.01)
(Continued)

(52) U.S. Cl.
CPC .............. *G06F 30/20* (2020.01); *E21B 49/00* (2013.01); *G01V 1/306* (2013.01); *G01V 99/00* (2013.01);
(Continued)

(58) Field of Classification Search
CPC .......... G06F 30/20; G06F 30/00; G06F 30/23; G06F 9/455; G06F 17/11; G06F 17/16;
(Continued)

(56) References Cited

U.S. PATENT DOCUMENTS

| 5,079,948 A | 1/1992 | Collins et al. |
| 6,826,520 B1 | 11/2004 | Khan et al. |

(Continued)

FOREIGN PATENT DOCUMENTS

| CN | 102165449 A * | 8/2011 | ............. E21B 43/00 |
| CN | 102187342 A * | 9/2011 | ......... G06F 17/5009 |

(Continued)

OTHER PUBLICATIONS

Barker, John W., and Sylvain Thibeau. "A critical review of the use of pseudorelative permeabilities for upscaling." SPE Reservoir Engineering 12.2 (1997): 138-143.
(Continued)

*Primary Examiner* — Kandasamy Thangavelu
(74) *Attorney, Agent, or Firm* — Tenley Krueger; Baker Botts L.L.P.

(57) ABSTRACT

A three-dimensional reservoir simulator used for automated upscaling relative permeability and capillary pressure in multi-porosity systems comprising disparate rock-types. A coarse-scale single-porosity model incorporating multi-porosity model properties may be derived from a fine-scale single-porosity model based, at least in part, on simulation of a model comprising data from one or more regions of interest. Real-world and laboratory measurements of the one or more regions of interest may be provided to the fine-scale single-porosity simulation model and the fine-scale single-porosity model may be subjected to one or more fractional flow simulation processes and one or more displacement simulation processes. The fine-scale model properties may
(Continued)

be modified based, at least in part, on the results of the one or more fractional flow simulation processes and one or more displacement simulation processes. Coarse scale-model properties may be derived from the fine-scale single-porosity model properties by upscaling the fine-scale single-porosity model. The coarse-scale single-porosity simulation model incorporating multi-porosity model properties may be used to improve operational decision-making, including drilling operations and reservoir management.

18 Claims, 10 Drawing Sheets

(51) Int. Cl.
  *E21B 49/00*  (2006.01)
  *G01V 99/00*  (2009.01)
  *G06F 30/00*  (2020.01)
  *G06F 30/23*  (2020.01)
  *G01V 1/30*  (2006.01)
  *G06F 9/455*  (2018.01)

(52) U.S. Cl.
  CPC .............. *G06F 9/455* (2013.01); *G06F 30/00* (2020.01); *G06F 30/23* (2020.01); *G06Q 50/02* (2013.01)

(58) Field of Classification Search
  CPC ..... G06F 17/5009; G06F 19/00; G01V 99/00; G01V 1/306; G01V 99/005; G01V 3/32; G06Q 50/02; E21B 43/00
  See application file for complete search history.

(56) References Cited

U.S. PATENT DOCUMENTS

| | | | |
|---|---|---|---|
| 10,480,314 B2 * | 11/2019 | Ziauddin | ................ G06F 30/00 |
| 2010/0191511 A1 | 7/2010 | Hsu et al. | |
| 2012/0158380 A1 * | 6/2012 | Hajibeygi | ............... G06F 17/11 703/2 |
| 2012/0241149 A1 * | 9/2012 | Chen | ........................ G01V 3/32 166/250.01 |
| 2015/0019183 A1 | 1/2015 | Suzuki | |

FOREIGN PATENT DOCUMENTS

| | | | | |
|---|---|---|---|---|
| EP | 1896876 B1 * | 4/2013 | ............. | G01V 11/00 |
| WO | WO 2008/008121 A2 * | 1/2008 | ............. | G06F 17/16 |
| WO | 2012/118864 A2 | 9/2012 | | |
| WO | WO 2012/118867 A2 * | 9/2012 | ............. | G06F 19/00 |
| WO | 2017/095395 A1 | 6/2017 | | |

OTHER PUBLICATIONS

Corey, Arthur Thomas, and C. H. Rathjens. "Effect of stratification on relative permeability." Journal of Petroleum Technology 8.12 (1956): 69-71.

Pickup, Gillian E. "Steady-state upscaling: From lamina-scale to full-field model." European Petroleum Conference. Society of Petroleum Engineers, 1998.

Takahashi, S., N. Tokuda, and T. Nakashima. "Upscaling method of relative permeability from plug core to whole core." International symposium of the society of core analysts held.—Abu Dhabi, UAE. 2004.

Tokuda, N. "Development of automated history-matching program base on genetic algorithm for X-ray CT core flooding experiment." International Symposium of the Society of Core Analysts.(2004). Abu Dhabi, United Arab Emirates. 2004.

International Search Report and Written Opinion issued in related PCT Application No. PCT/US2017/017826 dated Nov. 9, 2017, 11 pages.

* cited by examiner

DUAL POROSITY DUAL PERMEABILITY

AUTOMATED UPSCALING OF RELATIVE PERMEABILITY AND CAPILLARY PRESSURE IN MULTI-POROSITY SYSTEMS

CROSS-REFERENCE TO RELATED APPLICATION

The present application is a U.S. National Stage Application of International Application No. PCT/US2017/017826 filed Feb. 14, 2017, which is incorporated herein by reference in its entirety for all purposes.

FIELD OF THE DISCLOSURE

The present disclosure generally relates to reservoir characterization and more particularly to systems and methods for automated up scaling of relative permeability in multi-porosity systems comprising disparate rock-types using a three-dimensional (3D) reservoir simulator to an amalgamated single porosity-type representation.

BACKGROUND

The identification of rock-types, also referred to as petrofacies or electrofacies, as a method of reservoir and porous media characterization is indispensable for accurate prediction of hydrocarbon production from subsurface reservoirs. Identifying petrofacies or electrofacies is an essential process for upscaling, which is a part of the combined reservoir characterization and predictive analysis, or simulation process. Upscaling refers to the process of assigning petrophysical and hydraulic conductivity properties determined from smaller scale measurements to a larger scale, which would typically be used to describe subsurface rock-types in the grid-cells of a reservoir simulation model. The petrofacies or electrofacies are used in conjunction with the disparate petrophysical properties, hydraulic properties, or combinations thereof to spatially characterize multiphase, or fractional fluid flow, behavior in the cells of the 3D geocellular grid.

Multi-porosity is one such hydraulic property that may be measured at smaller scales. However, because multi-porosity parameters complicate subsurface fluid transfer analysis and therefore increase the difficulty of such analysis, conventional upscaling techniques assume all rock-types are uniformly connected to simplify upscaling solutions. In reality, porous media often comprise multiple rock-types comprising multiple porosity-types which may be defined by disparate inter- and intra-rock-type connectivity. Consequently, conventional upscaling fails to accurately model displacement of subsurface fluids within porous media. Incorporating multi-porosity properties of the multiple rock-types may improve simulation models of porous media, which, in turn, may enable improved operational decision-making, including drilling operations and reservoir management.

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

Figure 1:
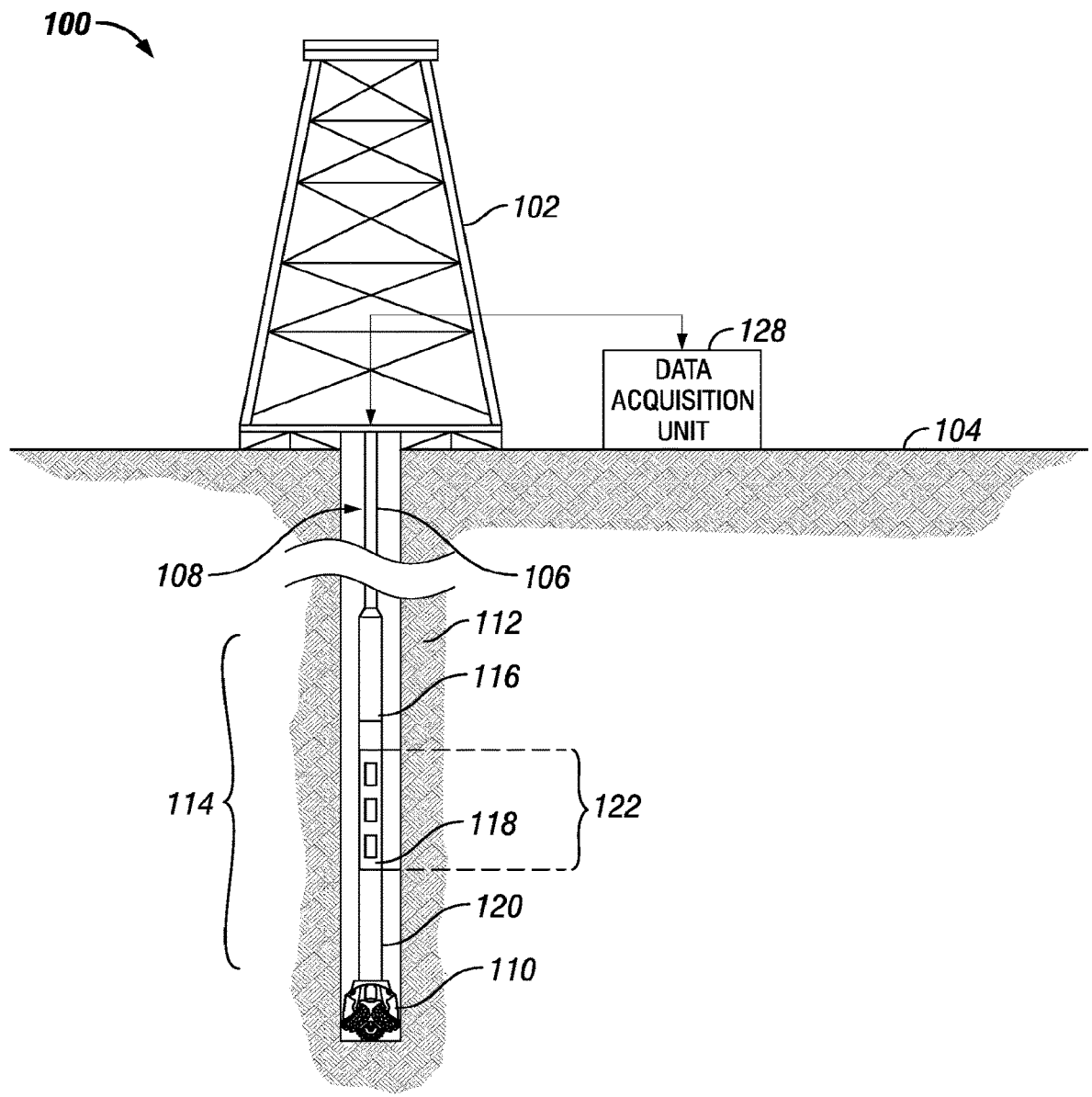
FIG. 1 is a cross-sectional schematic diagram depicting an example wellbore environment for acquiring whole core, according to one or more aspects of the present disclosure.

The present disclosure overcomes one or more deficiencies in the prior art by providing systems and methods for automated upscaling of relative permeability in multi-porosity systems comprising disparate rock-types using a three-dimensional (3D) reservoir simulator to develop an amalgamated single porosity-type representation.

A model of fluid exchange between each porosity type within a fine-scale model, including relative permeability, absolute permeability, and capillary pressure to express fluid transport, enables creation of a coarse-scale model for multi-porosity, such that full-field analysis of fluid exchange may be simulated to support operational decision-making. The model of fluid exchange may be procedurally created using relative permeability upscaling based on fractional flow and displacement procedures. Using automated steady- and unsteady-state displacement procedures enables computation of relative permeability for immiscible multiphase/multicomponent fluid systems. The effect of stratification on multiphase/multicomponent flow in permeable media allows for the differentiation of rock-type volume fraction effect from the pore space geometry/distribution effect. Flow rate and capillary pressure description may allow for upscaling of relative permeability by viscous and capillary limit upscaling processes. Multiphase/multicomponent relative permeability may be computed for disparate natural and composite geometries with multiple rock-types such that the effect of fluid exchange across incongruent independent rock-types differentiated by geometry may be modeled.

The present invention may improve upon traditional fractional flow analysis by reducing computation time and user interaction. By incorporating convergence analysis, the present invention enables the simulation to execute additional fractional flow analyses once convergence is achieved, eliminate the need for users to supervise the process, and terminate non-converging simulations as soon as that determination may be made. The present invention similarly enables increased accuracy from the simulation results by modeling core flooding fractional flow processes that occur in a physical lab to derive absolute and relative permeability. Similarly, the present invention may improve simulation of core properties over known methods by considering porosity types and communication of fluid between porosity types.

In a one or more embodiments, a method for up scaling fine-scale model properties in a multi-porosity system, comprising: selecting a first region of a porous media to be upscaled, wherein the first region comprises a first one or more regional subsurface properties; generating a first fine-scale single-porosity simulation model; initializing the first fine-scale single-porosity simulation model based, at least in part, on the first one or more regional subsurface properties; calculating a first absolute permeability and a first relative permeability for the first fine-scale single-porosity simulation model based, at least in part, on a first one or more fractional flow simulation processes; calculating a first capillary pressure for the first fine-scale single-porosity simulation model based, at least in part, on a first one or more displacement simulation processes; upscaling the first fine-scale single-porosity simulation model to derive a first coarse-scale single-porosity model; and altering one or more subsurface operations based, at least in part, on the first coarse-scale single-porosity simulation model.

In one or more embodiments, a non-transitory computer readable medium storing one or more instructions that, when executed, causes a processor to: select a first region of a porous media to be upscaled, wherein the first region comprises a first one or more regional subsurface properties; generate a first fine-scale single-porosity simulation model; initialize the first fine-scale single-porosity simulation model based, at least in part, on the first one or more regional subsurface properties; calculate a first absolute permeability and a first relative permeability for the first fine-scale single-porosity simulation model based, at least in part, on a first one or more fractional flow simulation processes; calculate a first capillary pressure for the first fine-scale single-porosity simulation model based, at least in part, on a first one or more displacement simulation processes; upscale the first fine-scale single-porosity simulation model to derive a first coarse-scale single-porosity model; and display at least one of the first absolute permeability and the first relative permeability and the first capillary pressure of the first coarse-scale single-porosity simulation model.

In one or more embodiments, a method for upscaling relative permeability in a multi-porosity system, comprising: selecting a region of a porous media to be upscaled, wherein the region comprises one or more regional subsurface properties, and wherein one or more of the one or more regional subsurface properties is based at least in part on analysis of a core sample of the region; generating a fine-scale single-porosity simulation model; initializing the fine-scale single-porosity simulation model based, at least in part, on the one or more regional subsurface properties; calculating an absolute permeability and a relative permeability of the fine-scale single-porosity simulation model based, at least in part, on one or more fractional flow simulation processes, wherein one or more fractional flow simulation processes comprise: selecting a pressure build up stage; comparing an injection rate with a production rate, wherein the injection rate and the production rate correspond to the pressure build up stage; calculating an absolute permeability based, at least in part, on the injection rate and the production rate; and calculating an relative permeability based, at least in part, on the absolute permeability; calculating a capillary pressure of the fine-scale single-porosity simulation model based, at least in part, on one or more displacement simulation processes, wherein the one or more displacement simulation processes comprise saturating a core sample of the first region with a first fluid; injecting a second fluid above the first region; injecting the first fluid below the first region; generating a fine-scale discretized model of the core sample of the first region based on saturation of the first region with a first fluid; incorporating in the fine-scale discretized model, injection of a second fluid above the first region; and calculating the capillary pressure based at least in part on saturation of the first region and injection of a second fluid above the first region, using fine-scale discretized model; using the fine-scale single-porosity simulation model to derive a first coarse-scale single-porosity model; performing flow simulation of the reservoir using the first coarse-scale single porosity simulation model; and altering one or more subsurface operations using simulation results obtained from the flow simulation of the reservoir wherein the one or more subsurface operations comprise at least one of a drilling operation and a reservoir management operation.

Illustrative embodiments of the present invention are described in detail herein. In the interest of clarity, not all features of an actual implementation may be described in this specification. It will, of course, be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

Various aspects of the present disclosure may be implemented in various environments. FIG. 1 is a cross-sectional schematic diagram depicting an example wellbore environment for acquiring subsurface data and samples, including whole cores, and pressure and fluid sample data, to analyze one or more subsurface properties according to one or more aspects of the present disclosure. An example wellbore environment 100 for acquiring subsurface data comprising pressure change and fluid displacement data, according to one or more aspects of the present disclosure, is illustrated. The wellbore environment 100 includes a derrick 102 positioned at a surface 104. The derrick 102 may support components of the wellbore environment 100, including a drill string 106. The drill string 106 may include one or more segmented pipes (not shown) that extend below the surface 104 in a wellbore 108. The drill string 106 may transmit drilling fluid (or drilling mud) necessary to operate a drill bit 110 positioned at the end of the drill string 106. The mud transmitted by the drill string 106 may provide the torque necessary to operate the drill bit 110. The weight of the drill string 106 may prove an axial force on the drill bit 110, that together with the rotation of the drill bit 110, may aid in drilling the wellbore 108 through subsurface formations 112 in the earth. Pressure, flow rate, and other production data may be captured using a data acquisition unit 128. Captured data may be used for simulation or modeling calibration, to guide drilling operations and production management, or any combination thereof.

The drill string 106 includes a bottom hole assembly 114 positioned on the drill string 106 uphole of the drill bit 110. The bottom hole assembly 114 includes a combination of various components, such as one or more drill collars 116, a seismic tool 118, and a downhole motor assembly 120 for housing a motor for the drill bit 110. In some aspects, the measurement devices may include an array of sensors 122, which may include pressure and flow rate sensors. While FIG. 1 illustrates a onshore subsurface environment at a surface 104, the present disclosure additionally contemplates an offshore environment (not shown).

Any one or more embodiments of the present disclosure may be implemented through a computer-executable program of instructions, such as program modules, generally referred to as software applications or application programs executed by a computer. A software application may include, for example, routines, programs, objects, components, data structures, any other executable instructions, or any combination thereof, that perform particular tasks or implement particular abstract data types. The software application forms an interface to allow a computer to react according to a source of input. For example, Nexus Desktop™ by Landmark Graphics Corporation may be used as an interface application to implement any one or more embodiments of the present disclosure. The software application may also cooperate with other applications or code segments to initiate a variety of tasks based, at least in part, on data received, a source of data, or any combination thereof. Other applications or code segments may provide optimization components including, but not limited to, neural networks, earth modeling, history-matching, optimization, visualization, data management, and economics. The software application may be stored, carried, or both on any variety of memory such as CD-ROM, magnetic disk, optical disk, bubble memory, and semiconductor memory (for example, various types of RAM or ROM). Furthermore, the software application and one or more inputs or outputs may be transmitted over a variety of carrier media including, but not limited to wireless, wired, optical fiber, metallic wire, telemetry, any one or more networks (such as the Internet), or any combination thereof.

Moreover, those skilled in the art will appreciate that one or more of the embodiments may comprise a variety of computer-system configurations, including hand-held devices, multiprocessor systems, microprocessor-based or programmable consumer electronics, minicomputers, mainframe computers, and any combination thereof. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may. therefore, be implemented in connection with various hardware, software, or any combination thereof, in a computer system, information handling system, or other processing system.

Figure 2:
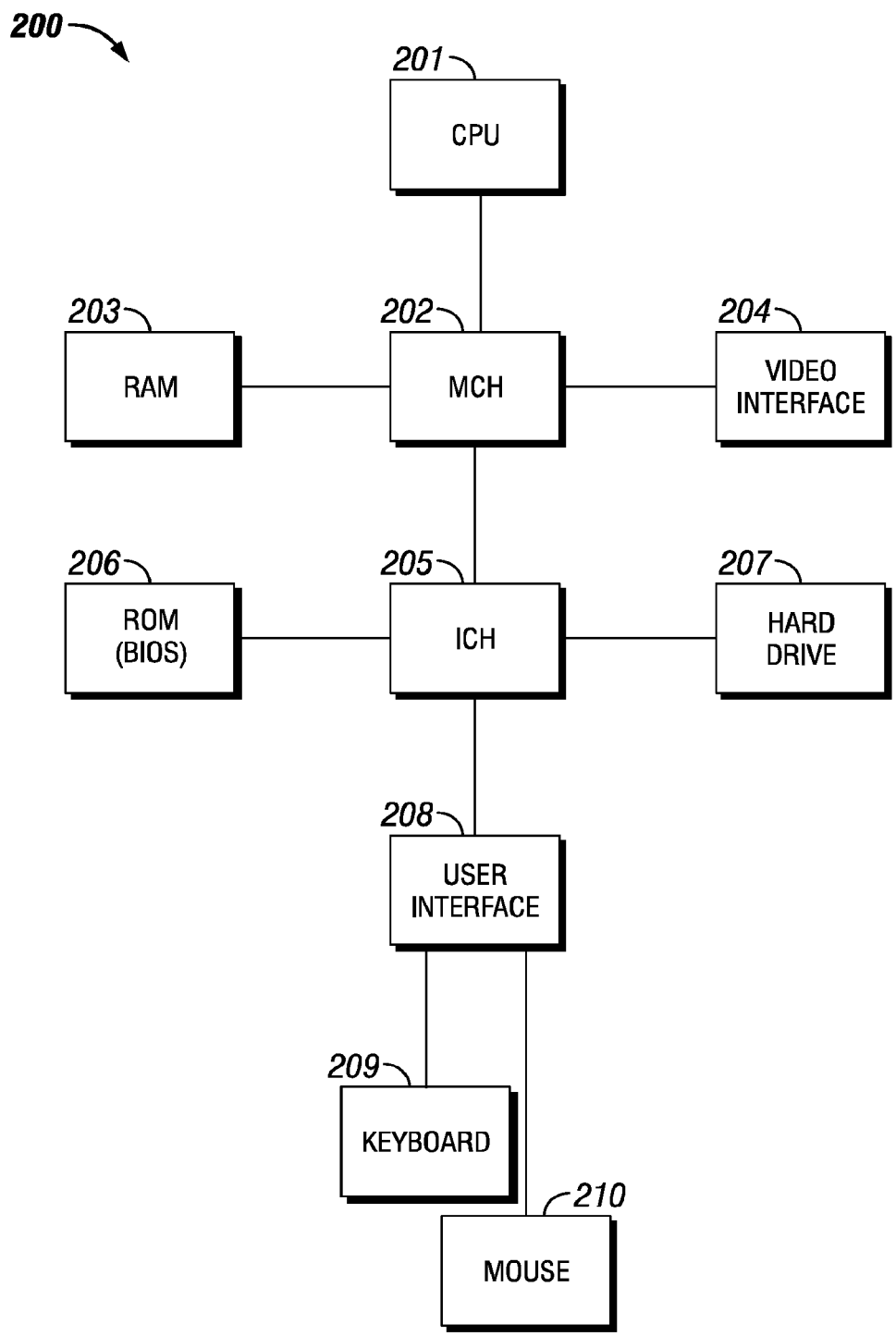
FIG. 2 is a diagram illustrating an example information handling system, according to one or more aspects of the present disclosure.

Referring now to FIG. 2, a block diagram illustrates one embodiment of a system for implementing one or more embodiments of the present invention. The system includes a computing device 200, sometimes referred to as a computing system or information handling system, which comprises memory such as random access memory (RAM) 203, application programs (not shown here), a user interface 208 comprising a mouse 210 and a keyboard 209, a video interface 204, and a central processing unit (CPU) 201. The CPU 201, the video interface 204, and the RAM 203 may be connected a memory controller hub (MCH) 202. The system may also include one or more storage devices, such as a read-only memory (ROM) storage element containing instructions for a basic input and output system (BIOS) 206 and a hard drive 207. The ROM 206, the hard drive 207, and the user interface 208 may be connected to one another via an input/output controller hub (ICH) 205. The MCH 202 and ICH 205 may be connected to one another. The computing device is only one example of a suitable computing environment and is not intended to suggest any limitation as to the scope of use or functionality of the disclosure.

A memory or storage device primarily stores one or more software applications or programs, which may also be described as program modules containing computer-executable instructions, which may be executed by the computing unit for implementing one or more embodiments of the present disclosure. The memory, therefore, may include a multi-porosity upscaling module, which may enable one or more of the processes or sub-processes illustrated in FIGS. 6-8. The multi-porosity upscaling module may integrate functionality from additional or third party application programs including Nexus Desktop™ or from system files stored in memory or on a storage device. For example, Nexus Desktop™ may be used as an interface application to perform some of the steps in FIGS. 6-8. System files, such as an ASCII text file may be used to store the instructions, data input, or both for the reservoir simulator as may be required in, for example, step 601 of FIG. 6, step 701 of FIG. 7, or step 801 of FIG. 8 discussed herein. Although Nexus Desktop™ may be used as an interface application, any one or more other interface applications may be used, or the relative permeability upscaling module may be used as a stand-alone application.

Although the computing device 200 is shown as having one or more generalized memories, the computing device 200 typically includes a variety of non-transitory computer readable media. By way of example, and not limitation, non-transitory computer readable media may comprise computer storage media and communication media. The memory may include computer storage media, such as a ROM and RAM in the form of volatile memory, nonvolatile memory, or both. A BIOS, containing the basic routines that help to transfer information between elements within the computing unit, such as during start-up, is typically stored in the ROM. The RAM typically contains data, program modules, other executable instructions, or any combination thereof that are immediately accessible to, presently being operated on, or both by the processing unit. By way of example, and not limitation, the computing device 200 may include an operating system, application programs, other program modules, and program data.

The components shown in the memory may also be included in other removable/non-removable, volatile/non-volatile non-transitory computer storage media or the components may be implemented in the computing device 200 through an application program interface ("API") or cloud computing, which may reside on a separate computing device connected through a computer system or network (not shown). For example only, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/nonvolatile computer storage media that can be used in the exemplary operating environment may include, but are not limited to, magnetic tape cassettes, flash memory cards, digital versatile disks, digital video tape, solid state RAM, solid state ROM, or the like. The drives and their associated computer storage media discussed above provide storage of computer readable instructions, data structures, program modules, and other data for the computing unit.

The computing device 200 may receive commands or information from a user through the user interface 208 and the associated input devices such as a keyboard 209 and a mouse 210. Input devices may comprise a microphone, joystick, satellite dish, scanner, voice or gesture recognition, and the like (not shown). These and other input devices are often connected to the processing unit through the user interface 208 that is coupled to the ICH 205, but may be connected by other interface and bus structures, such as a parallel port or a universal serial bus (USB) (not shown).

A monitor or other type of display device (not shown) may be connected to the MCH 202 via an interface, such as a video interface 204. A graphical user interface ("GUI") may also be used with the video interface 204 to receive instructions from the user interface 208 and transmit instructions to the central processing unit 201. A GUI may be used to display the outputs of the processes described in FIGS. 6, 7, and 8, and may be used to prompt or display modification of subsurface operations or production activities. In addition to the video interface 204, the computing device 200 may also include other peripheral output devices such as speakers, printer, external memory, any other device, or any combination thereof (not shown), which may be connected through an output peripheral interface (not shown).

Although many other internal components of the computing device 200 are not shown, those of ordinary skill in the art will appreciate that such components and their interconnection are well known.

Figure 3:
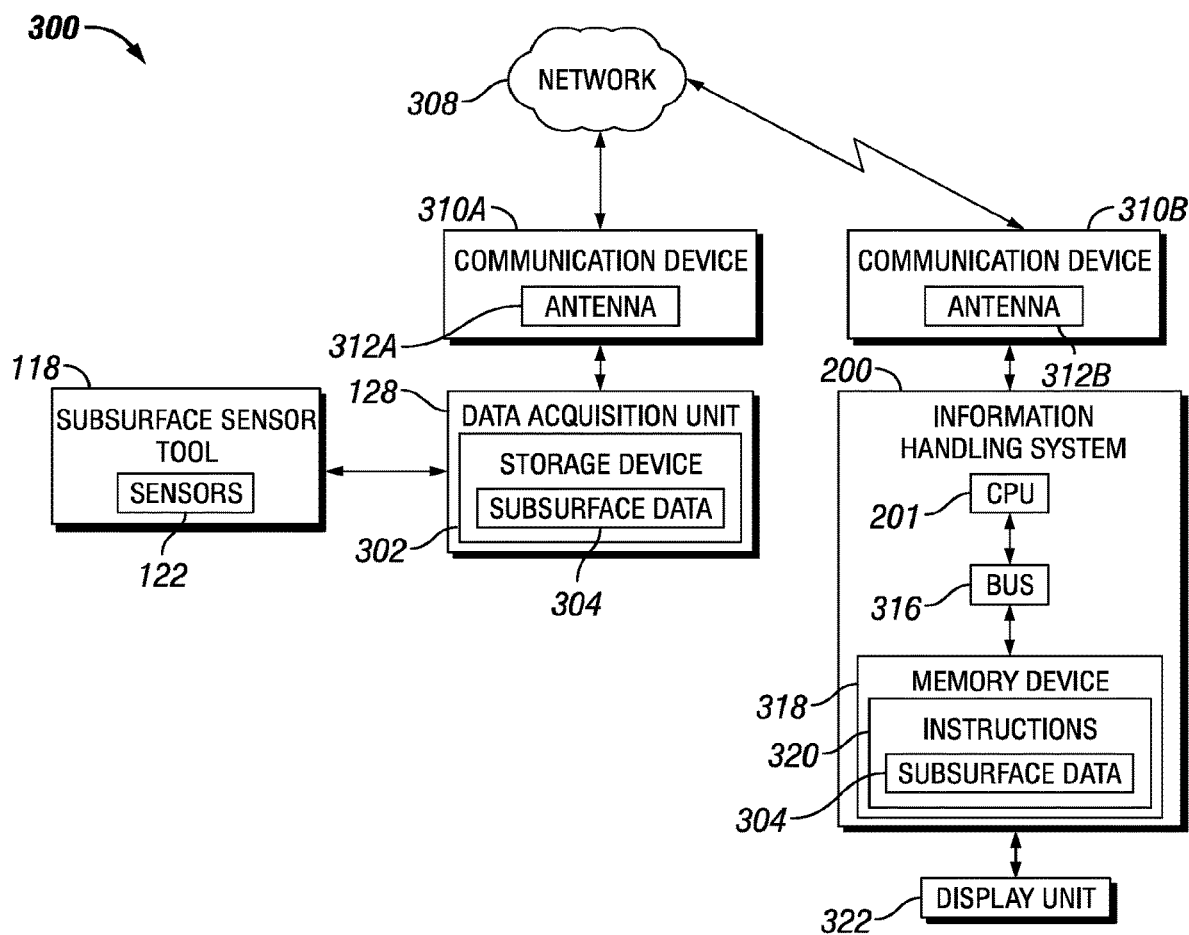
FIG. 3 is a diagram illustrating a system for collecting subsurface data, according to one or more aspects of the present disclosure.

Referring to FIG. 3, an assembly 300 may be used to capture subsurface data 304 which may provide feedback to a simulator. A subsurface sensor tool 118 comprising sensors 122 may detect changes in one or more subsurface conditions as described in FIG. 1, including pressure, flow rates, and other data. The information acquired by the subsurface sensor tool 118 may be provided to the data acquisition unit 128. The data acquisition unit 128, comprising a storage device 302, may store subsurface data 304 on the storage device 302. The storage device 302 may comprise a variety of storage media including CD-ROM, magnetic disk, optical disk, bubble memory, semiconductor memory (for example, various types of RAM or ROM), and any combination thereof. The subsurface data 304 may be shared with a communication device 310A comprising an antenna 312A. The communication device 310A may communicate with a network 308 via the antenna 312A, which may transmit subsurface data 304 to a second communication device 310B, comprising an antenna 312B. The second communication device 312B may then provide the subsurface data 304 to an information handling system 200, as described in FIG. 2. The information handling system 200 may store the received subsurface data 304 in a memory device 318, further comprising instructions 320 for handling the subsurface data 304. The instructions 320 may call for the subsurface data 304 to pass through the bus 316, which may include the ICH 205 or MCH 202 in FIG. 2, to reach the CPU 201 for processing. The CPU 201 may return output of the instructions 320 through the bus 316 to be stored in the memory device 318 or for display on a display unit 322. In certain embodiments, the subsurface data 304 may be provided to a simulator in real-time to enable modeling of subsurface conditions and operational decision making. In other embodiments, the subsurface data 304 may be stored for future processing and provision to a simulator for modeling of subsurface conditions and operational decision making.

The following description includes automated processes for fine-scale properties, including upscaling absolute permeability, relative permeability, and capillary pressure, using fractional fluid flow in systems comprising disparate rock-types described by multi-porosity type classification. In general, single-porosity-single-permeability models ignore inter-rock-type fluid communication. By including fine-scale multi-porosity information for a plurality of rock-types in the upscaling process, a single-porosity-single-permeability model may be obtained that improves upon traditional models by accounting for fluid communication between porosity-types, which traditional models ignore. While dual-porosity-dual-permeability assemblages are discussed, the present disclosure contemplates that any one or more embodiments are similarly applicable to analysis of higher dimension models.

Figure 4:
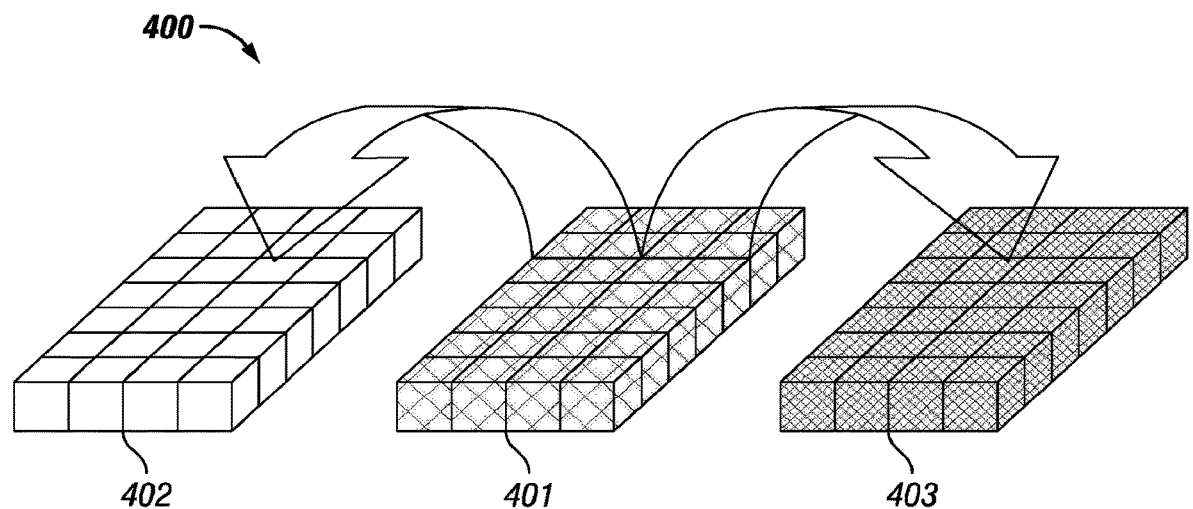
FIG. 4 is a diagram of a multi-porosity system containing two rock-types.
Figure 5:
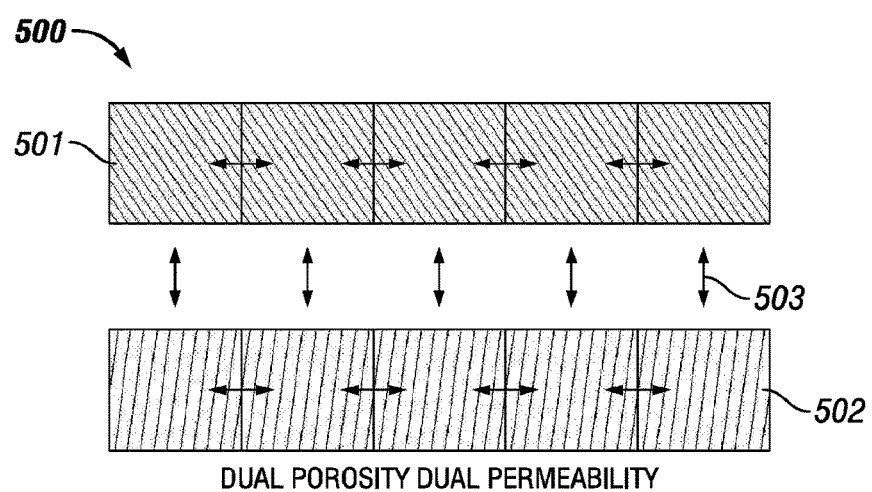
FIG. 5. is a diagram of a simplified model of interfluid transfer in a dual-porosity-dual-permeability assemblage.

Referring now to FIGS. 4 and 5, subsurface material may comprise multiple rock-types comprising multiple porosities. Dual-porosity-dual-permeability models enable efficient modeling of fluid flow within fractured porous media and may be calibrated based on a plurality of parameters to simulate a particular reservoir of a formation, for example, a reservoir of the subsurface formation 112 in FIG. 1. FIG. 4 illustrates an exemplary simplification of modeling subsurface fluid transfers in which a fine-scale grid-block comprising dual-porosity-dual-permeability assemblages 401 may be modeled as two rock-types with different porosities and permeabilities 402, 403. In more complex assemblages comprising three or more porosity-types, flow communication may only occur between select pairs of porosity-types and may not occur between other pairs of porosity-types. FIG. 5 illustrates an example of a fluid transfer model comprising intra- and inter-porosity fluid transfers. Transfers within grid-blocks of the same porosities 501, 502 illustrate intra-porosity fluid transfer and transfers between grid-blocks of different porosities 503 depict inter-porosity fluid transfer. Treating differing rock-types or inter- and intra-porosity fluid transfers separately before aggregating the results simplifies modeling calculations, and enables faster simulation results and far-field characterization of sparsely sampled mineral constituents that comprise porous media.

Figure 6:
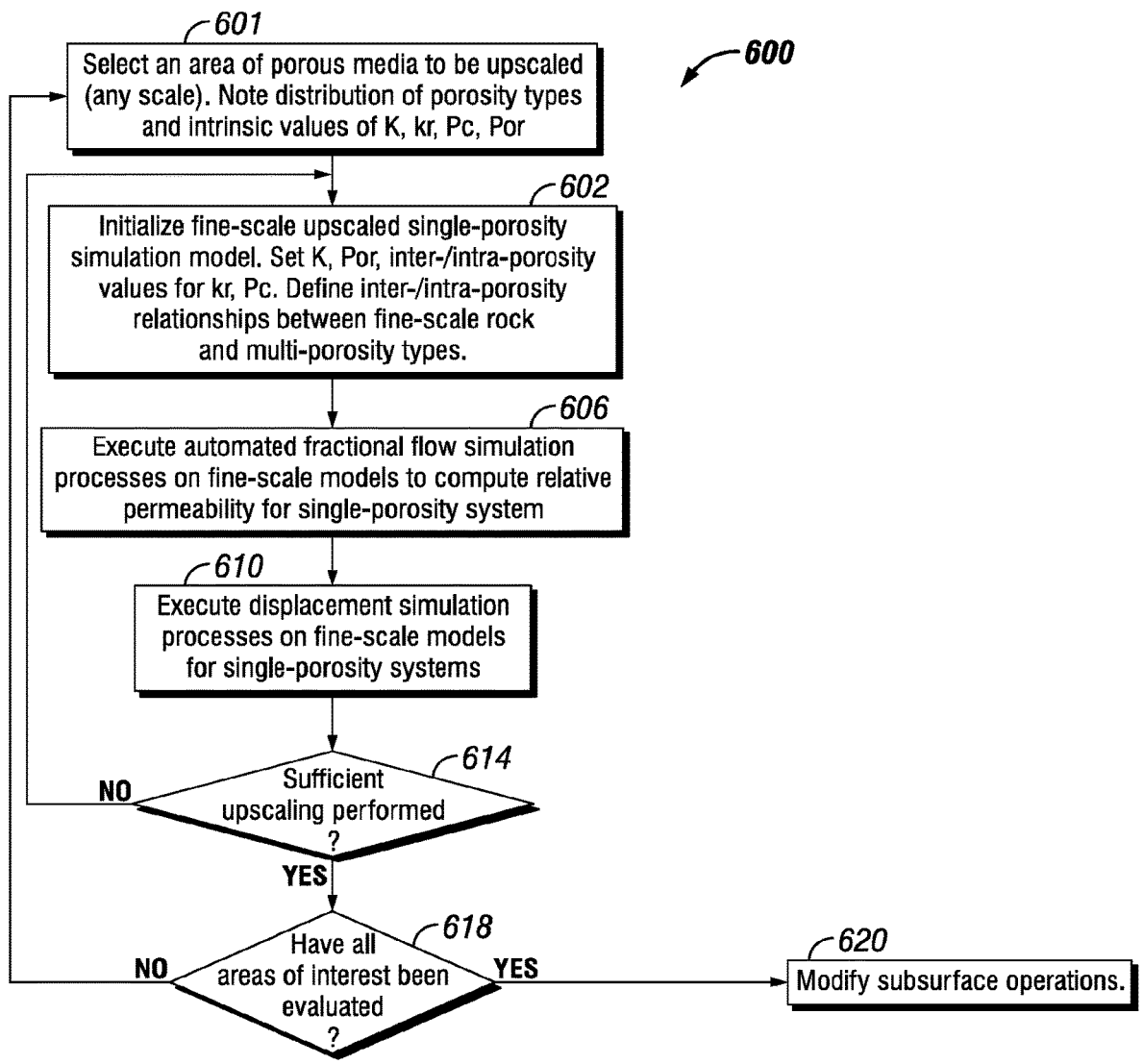
FIG. 6 is a flow diagram illustrating one embodiment of a process for implementing the present disclosure.

Referring now to FIG. 6, a flow diagram of one embodiment of a process 600 for implementing the present disclosure is illustrated. The process 600 illustrates the development of coarse-scale single-porosity model properties applicable to larger-scale analysis based on converging absolute and relative permeability simulations and converging capillary pressure simulations. The process includes the benefits of multi-porosity models, including more accurate fluid transfer modeling, and the benefit of fine-scale single-porosity models of porous media while performing the requisite simulations using a scale-efficient automated modeling process. The process outputs may include relative and absolute permeability, porosity, capillary pressure, and permeability tensors.

In step 601, an area of interest of the reservoir to be upscaled may be selected based on mineralogical and petrophysical properties. One or more porous media characteristics or properties of the selected region may be received as inputs. The one or more porous media properties may include, but are not limited to, the distribution of multiple porosity-types, as well as measured values of absolute permeability, relative permeability, capillary pressure, and porosity of the multiple porosity-types. Regional subsurface rock data, including porosity, may be acquired using computed tomography (CT), magnetic resonance imaging (MRI), or similar analyses in conjunction with equipment identified in FIGS. 1 and 3 or similar equipment. In one or more embodiments, a user selects the region via any one or more input devices including, but not limited to, display device 204, mouse 209, and keyboard 210 in FIG. 2.

In step 602, a fine-scale single-porosity simulation model, comprising fine-scale model properties, is initialized with the values provided in step 601. The initialization values may include, but are not limited to, the distribution of multiple porosity-types, as well as measured values of permeability, relative permeability, capillary pressure, and porosity of the multiple porosity-types. The numerical flow simulation model includes a description of the porous media to be modeled in terms of petrophysical properties; multi-porosity relationships; fluid model description, including fluid phases and pressure-volume-temperature characterization; rock-fluid interaction, including relative permeability; capillary pressure; and fluid contacts/equilibrium. The simulation may model the injection and production of fluid into, from, or both into and from the described porous media. Initialization of the simulation model may include defining inter- and intra-porosity relationships between fine-scale rock and multi-porosity types. The spatial arrangement of porosity types to account for which types may exchange fluids may be accounted for in the fine grid.

In step 606, one or more fractional flow simulation processes may be performed involving the fine-scale single-porosity simulation model created in step 602 to calculate absolute and relative permeability of one or more of the rock-types comprising the selected region. The automated steady- and unsteady-flow simulation process calculations comprising disparate rock types are described in greater detail in FIG. 7. In general, one or more fractional flow simulation processes may comprise injecting a mixture of two or more materials into permeable rock-types. This may be characterized as a two phase injection when two materials are injected. Injection materials may comprise fluids, gases, vapors, solids, and any combination thereof. The present disclosure contemplates that any injection fluid may be replaced with any one or more other types of injection material. The fractional flow for a given liquid component is the ratio of the rate of injection of the given liquid to the total rate of injection for the entire fluid flow. For example, a fractional fluid flow may be 82 percent water and 18 percent oil. The fractional flow of injected fluid may be compared with the fractional flow of production fluid, where production fluid is the fluid returned above the surface or sea. A difference between the ratio of production fluid and the ratio of injected fluid may indicate interaction with one or more subsurface fluid reservoirs. Similarly, a difference between the total injection rate and the total production rate may signal a change in the pressure of the injected fluid inside the model porous media. A pressure change may indicate fluid interaction with a fracture, vug, or occlusion; fluid interaction between rock-types with differing permeability, porosity, and wettability within the porous media; and any combination thereof.

The fractional flow simulation process outputs may be evaluated to determine if the absolute and relative permeability values are converging during the fractional flow simulation processes or if the processes should be terminated for failing to converge. If the permeability values are converging to correspond to within a predefined tolerance of expected absolute and relative permeability values, then process 600 may continue. However, if the automated factional flow simulation processes are failing to converge to within the predefined tolerance of expected absolute and relative permeability values, the entire simulation process 600 may terminate (not shown).

One or more of the fine-scale model properties may be modified based, at least in part, on the pressure and fractional fluid rate changes in the fractional flow simulation processes. The modification of the one or more fine-scale model properties may require validation. For example, an operator or automatic process may attempt to validate lab data by comparing simulation results to a lab-performed core flood.

In step 610, one or more displacement simulation processes are performed using the fine-scale single-porosity model. The displacement simulation processes are described in greater detail in FIGS. 8 and 11. Unlike the fractional flow simulation processes of step 606 in which two materials are injected, a displacement simulation process may involve injecting a single material to measure displacement of materials permeating the porous media. The one or more displacement simulations may be compared with a measured capillary pressure value of a core sample or a capillary pressure characterization curve to determine if the simulation process is converging to a realistic value. These capillary pressure simulation outputs may represent an improvement over traditional processes for calculating capillary pressure, because the displacement simulations may account for multiple porosity-types, unlike traditional models. Other means of evaluating capillary pressure may comprise multiple inter-porosity realizations, representative series, and parallel and random assemblages of rock-types.

The results of the displacement simulation process may be evaluated to determine if the capillary pressure values are converging during the displacement simulation processes or if the processes should be terminated for failing to converge. If the capillary pressure values are converging to within a predefined tolerance of expected capillary pressure values, then process 600 may continue. However, if the automated factional flow simulation processes are failing to converge to within a predefined tolerance of expected capillary pressure values, the entire simulation process 600 may terminate (See FIG. 8).

The fine-scale model properties, including for example, capillary pressure or a capillary pressure curve, may be manually or automatically modified based, at least in part, on the results of the displacement simulation processes performed. Displacement simulation process results may be confirmed by physical lab comparisons and simulation of fine-scale models of sample porous media. Fractional flow simulation processes may require manual tuning, include convergence analysis and flow rate adjustment. Additional displacement simulation processes may be iteratively performed using an increasingly finely-discretized grid until the grid is insensitive to further refinement (not shown).

In step 614, the resulting upscaled single-porosity model describing the porous media may itself require upscaling. An operator or automatic process may stipulate upscaling to describe a larger area of interest, to create an upscaled model that may be integrated with models of similar scale, to reduce the resource and computational requirements for evaluating the area of interest, or for other reasons. The process may repeatedly perform steps 602-610 if additional upscaling is required to achieve an increasingly coarse-scale model. Once the model achieves the desired level of upscaling based on one or more of the reasons identified above, the process 600 may proceed to step 618.

In step 618, the area of interest selected in 601 is compared with a list of areas of interest identified for evaluation. If an identified area of interest has not been evaluated, the process may repeat steps 601-614 outlined above for that area of interest. This process may involve evaluating, simulating, or both evaluating and simulating one or more cores such that multiple areas of interest may be modeled and upscaled. If all areas of interest have been evaluated, the process may proceed to step 620.

In step 620, the upscaled coarse-scale single-porosity properties may be used to modify one or more subsurface operations. The following examples are illustrative and are not intended to be limiting. For instance, an operator may use the model's upscaled relative permeability and capillary pressure values to evaluate an area of interest in preparation for future drilling and production, and to develop reservoir management strategies. Modification or alteration of drilling operations and reservoir management strategies may comprise identifying new drilling sites and recognizing opportunities for existing drilling sites, altering existing drilling operations, altering the rates and/or ratios of new and existing stimulation fluids, altering the rates and/or ratios of new and existing surfactants, altering the rates and/or ratios of other fluids and materials, altering pumping rates and/or introducing new and/or removing existing pumping equipment, applying enhanced oil recovery techniques, and any combination thereof. In one or more embodiments, altering or modifying drilling operations and reservoir management strategies may alter porous media wettability to displace fluids trapped within the media. In one or more embodiments, altering or modifying a subsurface operation may comprise altering a drilling depth, drilling location, drilling rate, altering a drilling angle, terminating drilling, and any combination thereof.

In one or more embodiments, operators may use the outputs of the present invention to determine whether to continue operations at a particular well and whether and where to drill additional wells. The operator may modify the one or more subsurface operations based on display of the simulation process outputs on a GUI or on printed documents. In one or more embodiments, the outputs of the process may be displayed in graphical form. Alternatively, a process receiving real-time data from subsurface operations may directly alter operations based on the upscaled coarse-scale single-porosity properties.

Figure 7:
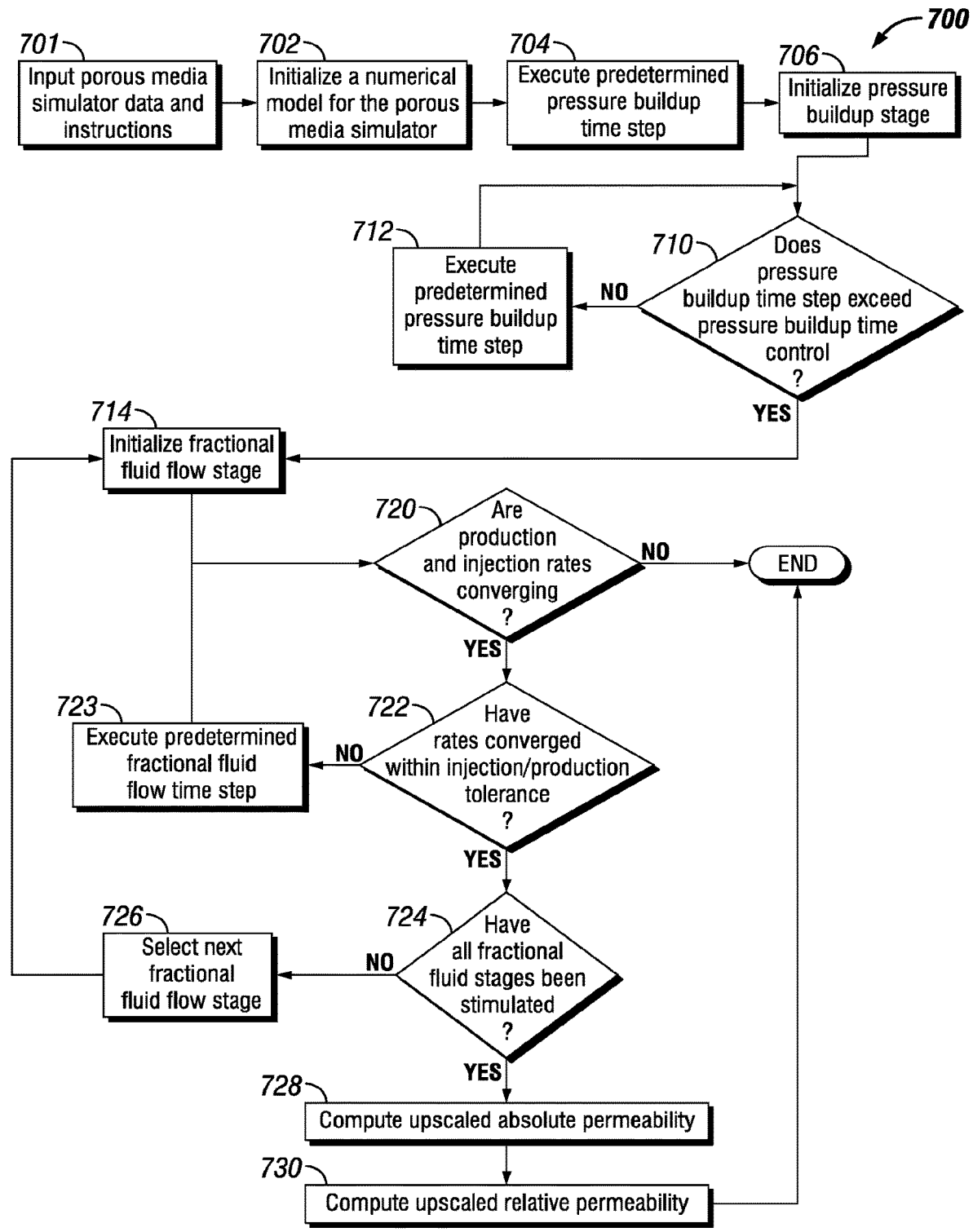
FIG. 7 is a flow diagram illustrating one embodiment of a process for computing absolute and relative permeability using automated steady- and unsteady-flow simulation processes.

FIG. 7 is a flow diagram illustrating one embodiment of the process for computing absolute and relative permeability using automated steady- and unsteady-flow simulation processes, as described in step 606 of FIG. 6. A user may prompt computation of either steady-or unsteady-flow processes, at his or her discretion, or computation may be automatic. In step 701, porous media/core simulator data and instructions may be provided to a reservoir simulator, where said data may be acquired using processes and estimates that are well known in the art. The simulator data provided may comprise fine-scale derived rock properties, including but not limited to porosity, absolute permeability, relative permeability, and capillary pressure. The simulator data and estimates provided may comprise subsurface data acquired with subsurface drilling equipment identified in FIGS. 1 and 3. The simulator may generate core simulator instructions containing at least one fluid model/type, automated fractional flows, equilibrium descriptions, output simulator controls, injector/producer locations, and timings and pressure-volume-temperature (PVT) descriptions. These outputs may be used to formulate a numerical model of the core for simulation.

In step 702, the numerical model of step 701 may be provided to a pre-processing algorithm of the core simulator. The pre-processing algorithm may designate and assign the relative permeability and capillary pressure regions based on the instructions provided to the simulator by the user in step 701. The pre-processing algorithm may output an initialized model of the core for modeling by the simulator.

In step 704, the core simulator may operate on the numerical model to determine a pressure build-up time step. The simulator may advance a dynamic pressure build-up time step, where the time step may depend on the at least one fluid model/type, automated fractional flows, equilibrium descriptions, output simulator controls, injector/producer locations, and timings and pressure-volume-temperature (PVT) descriptions provided in step 701.

In step 706, the pressure build-up stage of the simulation may be initiated by running the simulator to increase the flow rate for a time period corresponding to the pressure build-up. Increasing the flow rate gradually may increase the pressure in the model and may also maintain a smooth pressure solution for the numerical model. A smooth pressure solution may avoid numerical instabilities which might cause saturation of the region of the model to oscillate. Upon initialization of the pressure build-up stage, the simulation may progress to step 710.

In step 710, an iteration counter of the numerical model is evaluated to determine whether a minimum number of pressure build-up time steps have occurred. If the number of pressure build-up time steps is less than or equal to the pressure build-up time control parameter established in step 701, the simulator transitions to step 712.

In step 712, the simulation increments the build-up phase iteration counter and additional pressure build-up is simulated, before returning to step 710 where the evaluation of the iteration counter for the pressure build-up stage may be re-evaluated. Once the iteration counter exceeds the pressure build-up time control parameter, the simulation may continue to step 714.

In step 714, the simulator may initialize a fractional fluid stage for the numerical model based on completion of the pressure build-up phase in steps 706-712 using user control parameters provided to the core simulator instructions in step 701. The simulation may track the number of simulated fractional flow stages that have been simulated by initializing a fractional flow stage counter in step 714 and incrementing the counter in step 723 after the simulator has simulated each fractional flow time step. The simulator may produce an injection rate based on an injection rate. The injection rate should be representative of a section of the fluid throughput in the porous media. Production rates are generated by running the simulator for a time increment corresponding to a predetermined fractional fluid flow time step based on injection rate data captured in the field.

In step 720, the simulation may evaluate whether the production rate produced by the simulator in step 714 or step 723 is converging with an injection rate. If production rate produced by the simulator in step 714 or step 723 is converging with the injection rate provided to the simulator, the simulation may continue to step 722 to quantify the convergence. If these rates are not converging, the simulation may terminate.

In step 722, the simulation may quantify the convergence of step 720 such that the quantified convergence may be compared with a predetermined tolerance. The predetermined tolerance may be provided by a user in step 701. If the injection and production rates have not converged to satisfy the predetermined tolerance, the simulation may continue to step 723. However, if the predetermined tolerance has been met, the simulation may continue to step 724, where the simulation may increase one fluid comprising the fractional flow and decrease another fluid comprising the fractional flow.

In step 723, the simulation may execute a flow simulation for the fractional flow stage time step determined in step 714. After executing the flow simulation, the simulation may return to step 720 to evaluate convergence of the production and injection rates.

In step 724, the simulation may determine if all fractional fluid flow stages have been evaluated based on data provided in step 701 and the fractional flow stage counter calculated in step 714. If additional fluid flow stages have not yet been evaluated, the simulation may continue to step 726 to select another fluid flow stage. If all fractional flow stages have been evaluated, the simulation may continue to step 728 to calculate absolute permeability.

In step 726, the simulation may select the next unevaluated fractional flow stage for evaluation. Steps 714-724 may be repeated for the selected unevaluated fractional flow stage. This process may repeat until all fractional flow stages have been evaluated by the simulation.

In step 728, the simulation may calculate an absolute permeability of the simulated core based on 100% initial component flow, that is, based on a single fluid flow. The calculations for absolute permeability use injection and production rates applied in the fractional flow stage beginning in step 714. Once the absolute permeability calculations are complete, the simulation may proceed to step 730.

In step 730, the simulation may use the collection of fractional flow results generated in step 723 and the absolute permeability value calculated in step 728 to calculate the relative permeability of the simulated core and the fractional flow simulation process terminates. The process outputs, including absolute permeability and relative permeability, may be used in automated steady- and unsteady-flow simulation processes and provided to other simulations, as described in step 606 of FIG. 6. In one or more embodiments, these outputs may be used to alter one or more subsurface operations.

Figure 8:
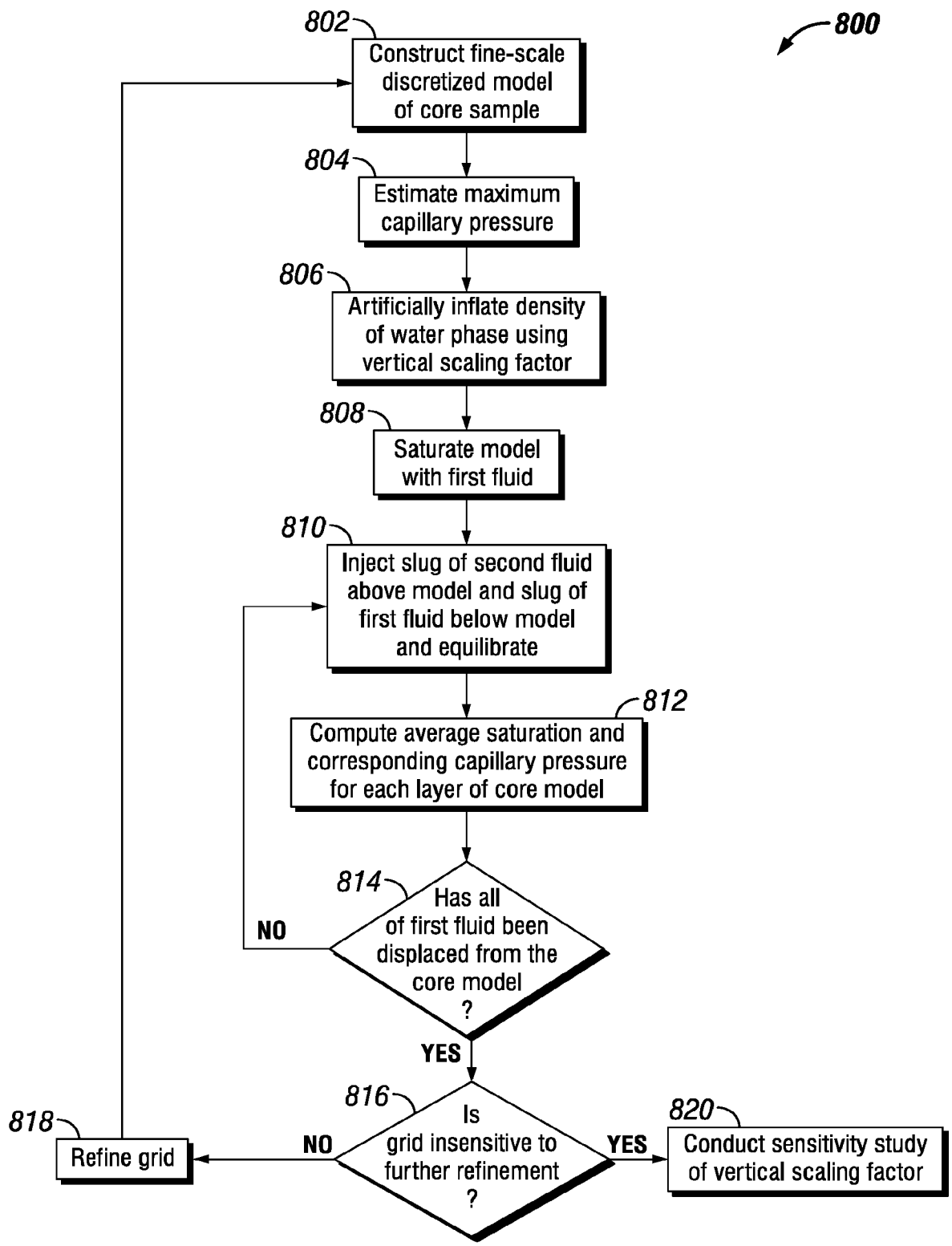
FIG. 8 is a flow diagram illustrating one embodiment of a process for computing a capillary pressure or characterization curve using displacement simulation processes.

Referring now to FIG. 8, which further illustrates the one or more displacement simulation processes performed in step 610 of FIG. 6. The displacement simulation processes are used to derive a capillary pressure, or single drainage capillary pressure curve, representative of the composite effects of a core sample comprising different porosity and rock types. The capillary pressure curve may generally describe capillary pressures and saturation values of a core sample and corresponding porosity and rock types. The curve may describe the interaction between capillary pressure and saturation for a variety of injection materials. Injection materials may comprise fluids, gases, vapors, solids, and any combination thereof. The present disclosure contemplates that any injection fluid may be replaced with any one or more other types of injection material, including but not limited to, water, saline, oil, gas, and mixtures thereof. The displacement simulation processes may beneficially reduce the amount and associated expense of laboratory capillary pressure measurements.

A displacement simulation process may require a core sample. For example, a core sample may be approximately several inches in diameter and one or more feet in length and may be acquired with equipment identified in FIG. 1 or similar subsurface drilling equipment. The process may require a fine-scale distribution of the rock types, porosity types, or both within the core sample, which may be obtained by computed tomography (CT), magnetic resonance imaging (MRI), or similar analyses. The displacement simulation process may further require capillary pressure curves for each rock type and porosity type found in the core sample. As an alternative to capillary pressure curves of the rock types comprising the core, a generic capillary pressure representation may be used across rock types with a J-Function type approach. Porosity and permeability values for the rock and porosity types contained in the sample may be required. Note, however, that permeability values may be estimated to save the expense of actual measurement of permeability. Finally, a simulator capable of modeling fine-scale displacement in core samples may be required.

Figure 9:
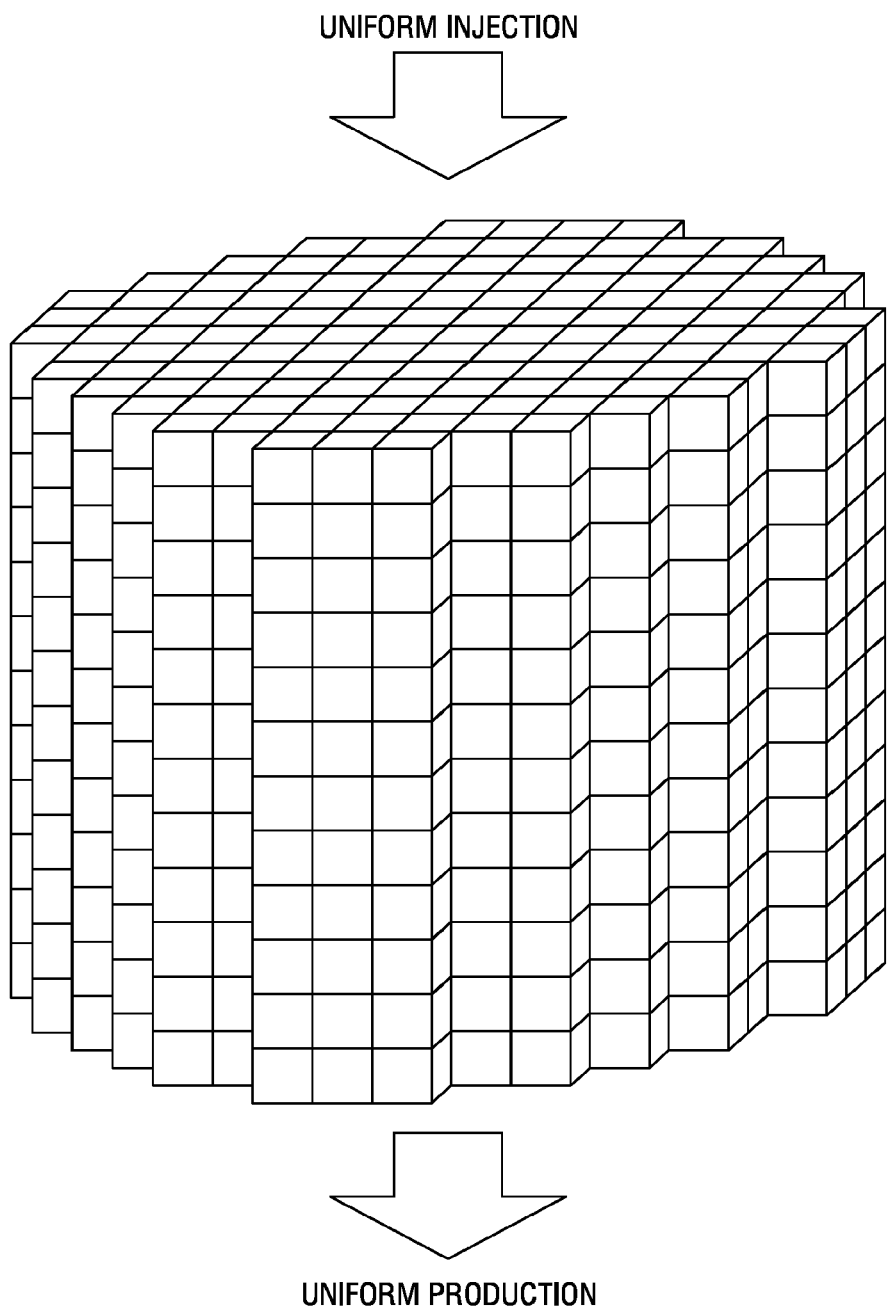
FIG. 9 illustrates a fine-scale discretized model of core samples comprising one or more grid blocks for use in displacement simulations, according to one or more aspects of the present disclosure.

The displacement simulation may be initialized in step 802 by constructing a fine-scale discretized model of a core sample. The fine-scale discretized model may comprise one or more grid blocks, as shown in FIG. 9. A moderately fine-scale model, comprising approximately 100,000 blocks configured in a 30×30×100 configuration may be used initially. A model comprising more blocks may reduce sensitivity, but may also increase computation times, and the grid block size may be selected accordingly. Insensitivity to further reduction in the size of a grid block may indicate a sufficiently fine scale model that is suitable for simulation.

In step 804, a conservative estimate for the maximum capillary pressure is made from correlations, including, but not limited to J-functions. To generate the full capillary pressure curve for the sample core, one or more physical experiments may be required, which may provide estimates for the curve. These estimates and the maximum capillary pressure may be provided to the simulation model during initialization.

In step 806, the maximum capillary pressure established in step 804 may be used to inflate the density of the water phase of the process, which may comprise scaling the density of water by a numerical factor. The goal is to set a value for the density of the water phase such that the estimated maximum capillary pressure is equal to $$(\rho_W - \rho_O) * g * h$$

where h is the height of the simulated core, $\rho_W$ is the density of water, $\rho_O$ is the density of oil, and g is the acceleration due to gravity. The inflation factor may be called the vertical scaling factor (VSF).

In step 808, the core model may be saturated with a first fluid, for example, water. The simulator may set the initial saturation, as part of a standard procedure for numerical flow processes.

In step 810, a slug of second fluid, for example oil, may be injected across the top of the saturated first region of the core while a slug of a first fluid is produced uniformly along the bottom of the saturated first region of the core The slug size of the second fluid may be large enough to produce a small vertical displacement of the first fluid downward from the first layer of discretized grid blocks of the core model. Once the necessary displacement has occurred, the core model may be allowed to equilibrate.

In step 812, the capillary pressure may be computed using the average saturation in each layer of the core model and the corresponding capillary pressure from the equation $$P_C = (\rho_W - \rho_O) * g * \Delta x$$

where $P_C$ is the capillary pressure at the residual wetting phase saturation and is the maximum capillary pressure of interest, $\rho_W$ is the density of water, $\rho_O$ is the density of oil, g is the acceleration due to gravity, and $\Delta x$ is the layer height of the model as measured above the lower face and to the grid block center for a given layer. Calculation of a capillary pressure curve is described in greater detail in FIG. 10.

In step 814, the process may evaluate whether the second fluid has fully displaced the first fluid from the saturated core model. If the first fluid has not yet been fully displaced from the core model, the process may return to step 810 for injection of additional slugs of the second fluid. Some allowances may be made for some portion of the first fluid to be held by capillary forces. Evaluation of whether the first fluid has been fully displaced may be made by measuring the pressure at the bottom of the model. An arbitrary reference pressure measured at the bottom of the model may be interpreted as full displacement of the first fluid and the process may continue to step 816.

In step 816, the process may evaluate the sensitivity of the grid of the core model. As indicated above, a grid may be sufficiently sensitive when the simulation is insensitive to further reductions in the grid size. This may be evaluated by comparing the improvement in simulation data between a first simulation at a given grid size and a subsequent simulation using a finer grid size against a predefined sensitivity threshold. If, for a given grid size, the capillary pressure curve generated changed significantly from the previously courser grid, the process of refinement should continue to step 818. If the analysis is determined to have become insensitive to refinement, as indicated by improvement below the sensitivity threshold, then the process may continue to 820.

In step 818, the initial grid may be refined by increasing the number of blocks defining the core model before steps 802-816 may be repeated using the refined grid, until the grid is insensitive to further refinement.

In step 820, a second sensitivity study of the VSF may be performed. In the second VSF study, the VSF factor may be reduced by half and steps 802-814 may be performed using a new model comprising two identical versions of the original model stacked one on top of the other. By comparing a computed capillary pressure value using subsequent displacement simulations while halving the VSF and doubling the model height, the process may converge upon a derived curve describing capillary pressure of the model core. This information may be used in step 610 of the process 600 described in FIG. 6. In one or more embodiments, the capillary pressure curve may be used to alter one or more subsurface operations.

Figure 10A:
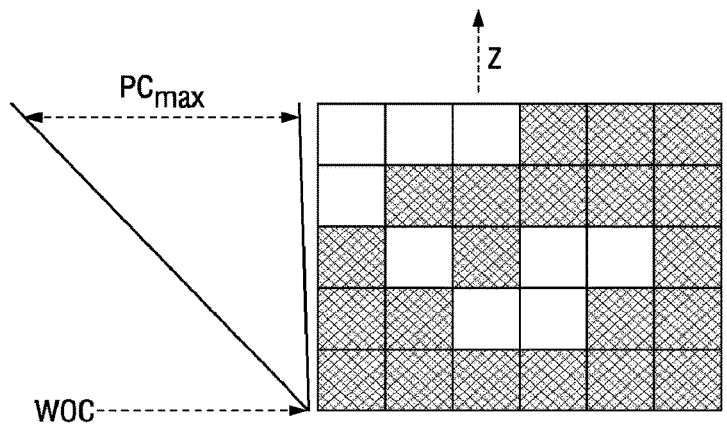
FIG. 10 illustrates a schematic operable for generation of a capillary pressure curve from drainage results of a displacement simulation process.
Figure 10B:
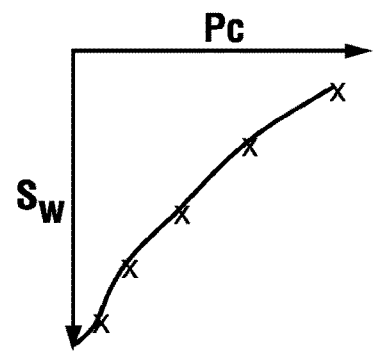

FIG. 10 illustrates computation of capillary pressure for a given layer. $S_W$ is the volume fraction of the pore space occupied by the water and $PC_{MAX}$ is the capillary pressure at the residual wetting phase saturation and is the maximum capillary pressure of interest. WOC is the vertical location where a transition from one fluid phase to another fluid phase begins, for example, a water phase to an oil phase. In such an example, the WOC may be where an oil column begins and a water column ends. Average saturation of a layer may be calculated by summing the saturation in each block of that layer and dividing by the total number of blocks in that layer. FIG. 10 illustrates how a capillary pressure curve may be constructed by incrementally lowering the water-oil contact through the vertical span of the core. In FIG. 10, the interconnectivity between multiple porosity types is not considered.

FIG. 11 illustrates a simplified version of the sequence of the displacement simulation process referenced in step 610 and described by the process in FIG. 8. The following describes an example of a water saturated core with a displacing oil, but is not intended to be limiting. FIG. 11 illustrates an idealization of a hypothetical core in which matrix, fracture, and vug porosity types occur and further assumes that all porosity types have uniform capillary pressure throughout. Accordingly, FIG. 11 does not show grid blocks at a resolution appropriate for simulation, but is intended to illustrate that a displacement experiment may enable improved accuracy when computing capillary pressure using the equation used in process 800, as compared with an ordinary equilibrium initialization. In particular, a displacement experiment may more accurately simulate the retention of water due to porosity than an ordinary equilibrium initialization.

Figure 11A:
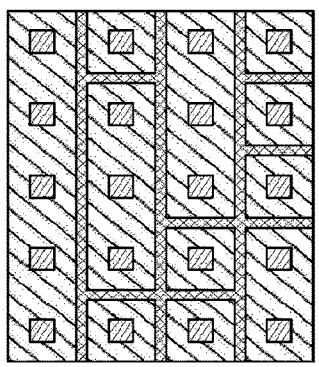
FIG. 11 illustrates a simplified version of the sequence of the displacement simulation process referenced in FIG. 6 and described in FIG. 8.
Figure 11B:
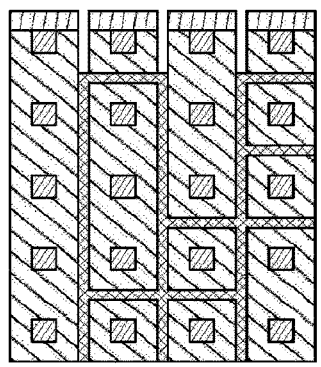
Figure 11C:
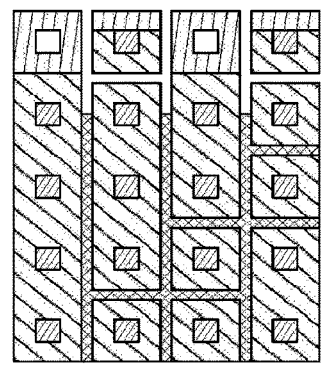
Figure 11D:
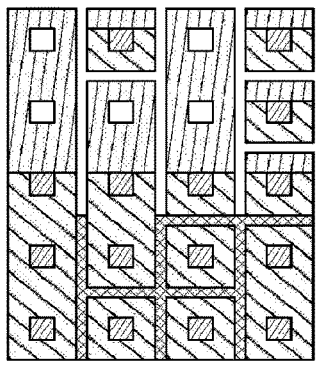
Figure 11E:
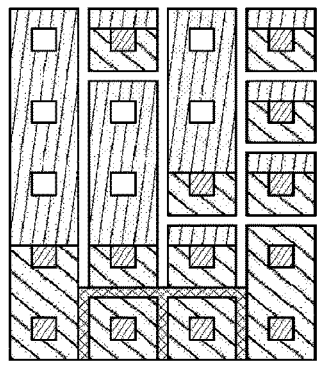
Figure 11F:
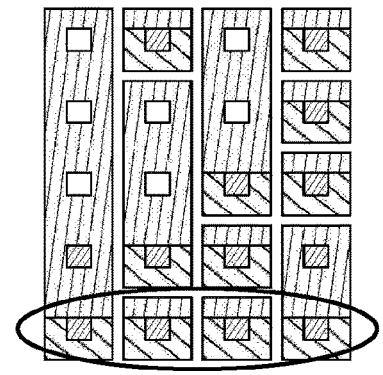

FIG. 11(a) illustrates the beginning of a displacement sequence in which all porosity types are initially fully saturated with water. FIG. 11(b) illustrates a point where the oil displacement in the fracture has reached the lower edge of the two indicated isolated matrix/vug regions. At this point, there is free water saturation as indicated above the fracture fluid level identified in FIG. 11(c) due to the capillary pressure curve of the matrix regions. As displacement proceeds, the amount of water in the two isolated regions of FIG. 11(b) may not be further reduced as shown in FIGS. 11(c)-(f). A similar phenomenon repeats for other isolated regions in FIGS. 11(c)-(f) as water is further withdrawn from the system by additional oil displacement. Note that once the water level is at or below the vug porosity regions within the matrix regions, the water from the vugs may immediately drain to the surrounding matrix as illustrated by FIGS. 11(c)-(f). FIG. 11(f) illustrates the total volume of water retained by performing the displacement sequence illustrated in FIGS. 11(a)-(f), which represents a significant improvement over ordinary equilibrium initialization and may thereby improve capillary pressure computations. For comparison, the circled region of FIG. 11(f) illustrates the volume of water used to compute capillary pressure when simulating displacement with ordinary equilibrium initialization.

Figure 12:
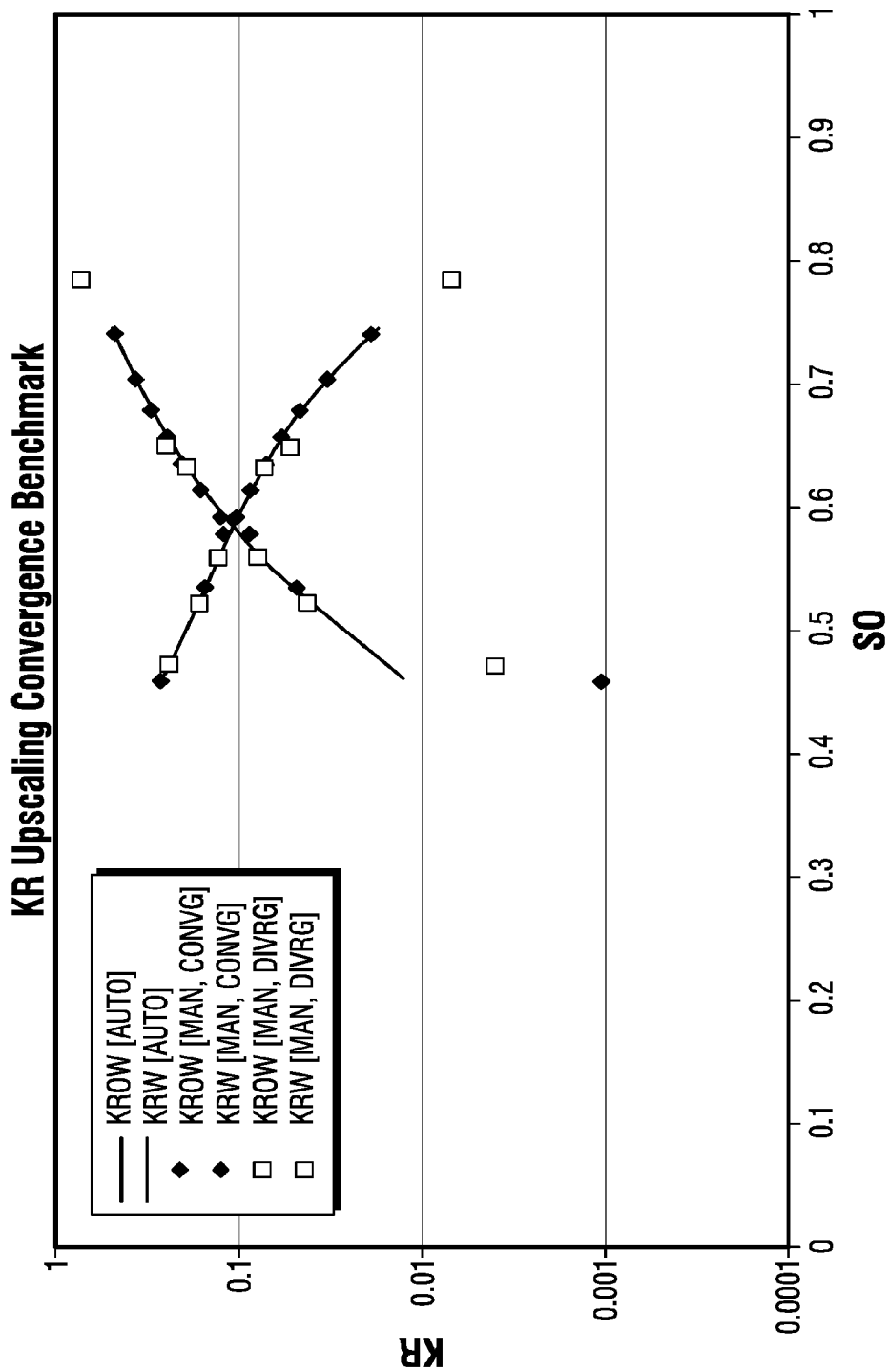
FIG. 12 illustrates the results of using three exemplary techniques to calculate relative permeability of water (KRW) and relative permeability of oil (KROW), according to one or more aspects of the present disclosure.

FIG. 12 illustrates the results of using three exemplary techniques to calculate relative permeability of water (KRW) and relative permeability of oil (KROW). According to one or more aspects of the present disclosure, a first technique labeled as "Auto" and comprising automatic submission, convergence analysis, and mimicked coreflooding experiments is determined and illustrated in FIG. 12. Also illustrated is a second technique labeled "Man, Convg" that requires longer run times to ensure convergence and does not mimic the fractional flow procedure conducted during the core floods described in step 606. A third technique labeled "Man,Divrg" illustrates upscaling relative permeability where the fractional flow experiments may quickly generate a divergent solution. As shown in FIG. 12, the first technique and second technique yield similar results because convergence occurs in both evaluations. However, the first technique achieves greater accuracy than the second technique because the first technique models the core flooding procedure described in step 606 of FIG. 6. In contrast, the second technique is initiated when the core is in a saturated state and only computes a pseudo-fractional flow because initial saturation is not a function of the previous steady-state fractional flow step.

The improved amalgamated single porosity-type representation of porous media may be used to manage subsurface reservoirs more efficiently than existing representations. The improved representation may be used to improve subsurface drilling and production operations, including manage operations, alter production and well scheduling, and may be used with enhanced oil recovery services. The improved amalgamated single porosity-type representation may be used to identify the location of subsurface fluids, assess volumetrics, understand how fluids move below the surface, and reduce experimental drilling at the beginning of operations.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof. In particular, with regards to the methods disclosed, one or more steps may not be required in all embodiments of the methods and the steps disclosed in the methods may be performed in a different order than was described.

The invention claimed is:

1. A method for upscaling fine-scale model properties in a multi-porosity system, comprising:
   selecting a first region of a porous media of a reservoir, wherein the first region comprises a first one or more regional subsurface properties;
   generating a first fine-scale single-porosity simulation model of the reservoir;
   initializing the first fine-scale single-porosity simulation model based, at least in part, on the first one or more regional subsurface properties including distribution of multiple porosity-types, and measured values of absolute permeability, relative permeability, capillary pressure and porosity of the multiple porosity-types;
   calculating a first absolute permeability and a first relative permeability for the first fine-scale single-porosity simulation model using simulation results of a first one or more fractional flow simulation processes;
   calculating a first capillary pressure for the first fine-scale single-porosity simulation model using simulation results of a first one or more displacement simulation processes, wherein calculating the first capillary pressure for the first fine-scale single-porosity simulation model comprises:
      generating a fine-scale discretized model of a core sample of the first region based on saturation of the first region with a first fluid;
      incorporating in the fine-scale discretized model, injection of a second fluid above the first region; and
      calculating the first capillary pressure based, at least in part, on saturation of the first region and injection of a second fluid above the first region, using the fine-scale discretized model;
   deriving a first coarse-scale single-porosity simulation model using simulation results of the first fine-scale single-porosity simulation model;
   performing flow simulation of the reservoir using the first coarse-scale single-porosity simulation model; and
   altering one or more subsurface operations using simulation results obtained from the flow simulation of the reservoir.

2. The method of claim 1, further comprising:
   selecting a second region of the porous media to be upscaled, wherein the second region comprises a second one or more regional subsurface properties;
   generating a second fine-scale single-porosity simulation model;
   initializing the second fine-scale single-porosity simulation model based, at least in part, on the second one or more regional subsurface properties;
   calculating a second absolute permeability and a second relative permeability for the second fine-scale single-porosity simulation model using simulation results of a second one or more fractional flow simulation processes;
   calculating a second capillary pressure for the second fine-scale single-porosity simulation model using simulation results of a second one or more displacement simulation processes;
   derive a second coarse-scale single-porosity simulation model using simulation results of the second fine-scale single-porosity simulation model; and
   reconciling the first coarse-scale single-porosity simulation model to the second coarse-scale single-porosity simulation model.

3. The method of claim 1, wherein calculating the first capillary pressure for the fine-scale single-porosity simulation model comprises refining the fine-scale discretized model of the core sample.

4. The method of claim 1, wherein calculating the first absolute permeability and the first relative permeability for the first fine-scale single-porosity simulation model further comprises:
   selecting a pressure build up stage;
   comparing an injection rate with a production rate, wherein the injection rate and the production rate correspond to the pressure build up stage;
   calculating the first absolute permeability based, at least in part, on the injection rate and the production rate; and
   calculating the first relative permeability based, at least in part, on the first absolute permeability.

5. The method of claim 1, wherein one or more subsurface operations comprise at least one of a drilling operation and a reservoir management operation.

6. The method of claim 5, wherein the reservoir management operation comprises at least one of altering a rate of pumping of one or more stimulation fluids and altering a ratio of a surfactant.

7. The method of claim 5, wherein the drilling operation comprises at least one of altering a drilling depth, drilling location, and drilling rate.

8. The method of claim 1, wherein the first one or more of the regional subsurface properties is based at least in part on an analysis of a core sample of the first region.

9. The method of claim 8, wherein the analysis of the core sample of the first region comprises one or more of a computed tomography scan and a magnetic resonance imaging scan of the core sample.

10. The method of claim 1, wherein the first one or more regional subsurface properties comprise at least one of absolute permeability, porosity, inter-porosity relative permeability, intra-porosity relative permeability, inter-porosity capillary pressure, and intra-porosity capillary pressure.

11. A non-transitory computer readable medium storing one or more instructions that, when executed, causes a processor to:
   select a first region a porous media of a reservoir, wherein the first region comprises a first one or more regional subsurface properties;
   generate a first fine-scale single-porosity simulation model of the reservoir;
   initialize the first fine-scale single-porosity simulation model based, at least in part, on the first one or more regional subsurface properties including distribution of multiple porosity-types, and measured values of absolute permeability, relative permeability, capillary pressure and porosity of the multiple porosity-types;

calculate a first absolute permeability and a first relative permeability for the first fine-scale single-porosity simulation model using simulation results of a first one or more fractional flow simulation processes;

calculate a first capillary pressure for the first fine-scale single-porosity simulation model using simulation results of a first one or more displacement simulation processes, wherein calculating the first capillary pressure comprises:
  generating a fine-scale discretized model of a core sample of the first region based on saturation of the first region with a first material;
  incorporating in the fine-scale discretized model, injection of a second material above the first region; and
  calculating the first capillary pressure based, at least in part, on saturation of the first region and injection of a second material above the first region, using the fine-scale discretized model;

derive a first coarse-scale single-porosity simulation model using simulation results of the first fine-scale single-porosity simulation model;

perform flow simulation of the reservoir using the first coarse-scale single-porosity simulation model; and alter one or more subsurface operations using simulation results obtained from the flow simulation of the reservoir.

12. The non-transitory computer readable medium of claim 11, wherein the one or more instructions, when executed, further causes the processor to:
  select a second region of the porous media to be upscaled, wherein the second region comprises a second one or more regional subsurface properties;
  generate a second fine-scale single-porosity simulation model;
  initialize the second fine-scale single-porosity simulation model based, at least in part, on the second one or more regional subsurface properties;
  calculate a second absolute permeability and a second relative permeability for the second fine-scale single-porosity simulation model using simulation results of a second one or more fractional flow simulation processes;
  calculate a second capillary pressure for the second fine-scale single-porosity simulation model using simulation results of a second one or more displacement simulation processes;
  derive a second coarse-scale single-porosity simulation model using simulation results of the second fine-scale single-porosity simulation model; and
  reconcile the first coarse-scale single-porosity simulation model to the second coarse-scale single-porosity simulation model.

13. The non-transitory computer readable medium of claim 11, wherein the one or more instructions, when executed, further causes the processor to refine the fine-scale discretized model of a core sample of the first region.

14. The non-transitory computer readable medium of claim 11, wherein the first material is a fluid and the second material is a fluid.

15. The non-transitory computer readable medium of claim 14, wherein the first fluid comprises at least one of water, saline, gas, and oil.

16. The non-transitory computer readable medium of claim 11, wherein the one or more instructions, when executed, further causes the processor to:
  select a pressure build up stage;
  compare an injection rate with a production rate, wherein the injection rate and the production rate correspond to the pressure build up stage;
  calculate the first absolute permeability based, at least in part, on the injection rate and the production rate; and
  calculate the first relative permeability based, at least in part, on the first absolute permeability.

17. The non-transitory computer readable medium of claim 11, wherein the one or more instructions, when executed, further causes the processor to display at least one of the first absolute permeability and the first relative permeability and the first capillary pressure of the first coarse-scale single-porosity simulation model.

18. A method for upscaling relative permeability in a multi-porosity system, comprising:
  selecting a region of a porous media of a reservoir, wherein the region comprises one or more regional subsurface properties, and wherein one or more of the one or more regional subsurface properties is based at least in part on analysis of a core sample of the region;
  generating a fine-scale single-porosity simulation model of the reservoir;
  initializing the fine-scale single-porosity simulation model based, at least in part, on the one or more regional subsurface properties;
  calculating an absolute permeability and a relative permeability of the fine-scale single-porosity simulation model using simulation results of one or more fractional flow simulation processes, wherein one or more fractional flow simulation processes comprise:
    selecting a pressure build up stage;
    comparing an injection rate with a production rate, wherein the injection rate and the production rate correspond to the pressure build up stage;
    calculating an absolute permeability based, at least in part, on the injection rate and the production rate; and
    calculating an relative permeability based, at least in part, on the absolute permeability;
  calculating a capillary pressure of the fine-scale single-porosity simulation model using simulation results of one or more displacement simulation processes, wherein the one or more displacement simulation processes comprise:
    generating a fine-scale discretized model of a core sample of the first region based on saturation of the first region with a first fluid;
    incorporating in the fine-scale discretized model, injection of a second fluid above the first region; and
    calculating the first capillary pressure based, at least in part, on saturation of the first region and injection of a second fluid above the first region, using the fine-scale discretized model;
  deriving a coarse-scale single-porosity simulation model using simulation results of the fine-scale single-porosity simulation model;
  performing flow simulation of a reservoir using the coarse-scale single-porosity simulation model; and
  altering one or more subsurface operations using simulation results obtained from the flow simulation of the reservoir, wherein the one or more subsurface operations comprise at least one of a drilling operation and a reservoir management operation.

* * * * *